(12) United States Patent
Takahashi

(10) Patent No.: US 6,522,181 B1
(45) Date of Patent: Feb. 18, 2003

(54) SEMICONDUCTOR MEMORY APPARATUS WHICH CAN EASILY ATTAIN REDUCTION OF ACCESS TIME

(75) Inventor: Hiroyuki Takahashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/640,180

(22) Filed: Aug. 17, 2000

(30) Foreign Application Priority Data

Sep. 8, 1999 (JP) .......................................... 11-254851

(51) Int. Cl.[7] ................................................ H03L 7/00
(52) U.S. Cl. ...................................... 327/141; 327/161
(58) Field of Search ................................ 327/141, 144, 327/149, 150, 152, 153, 161; 365/233

(56) References Cited

U.S. PATENT DOCUMENTS

| | | | | |
|---|---|---|---|---|
| 5,467,041 A | * | 11/1995 | Baba et al. .................. | 327/153 |
| 5,574,393 A | * | 11/1996 | Nguyen et al. .............. | 327/153 |
| 5,926,053 A | * | 7/1999 | McDermott et al. ......... | 327/150 |
| 6,100,735 A | * | 8/2000 | Lu ............................... | 327/161 |
| 6,304,511 B1 | * | 10/2001 | Gans et al. ................... | 327/161 |

FOREIGN PATENT DOCUMENTS

JP 8-102492 4/1996

* cited by examiner

Primary Examiner—Trong Phan
(74) Attorney, Agent, or Firm—Young & Thompson

(57) ABSTRACT

A semiconductor apparatus includes an input unit and a control unit. The input unit inputs a first signal and a generation signal. The generation signal is generated based on the first signal and a second signal. The control unit controls the input unit such that one of the first signal and the generation signal is outputted. The input unit inputs the first signal prior to the generation signal. The control unit controls the input unit such that the generation signal instead of the first signal is outputted after an expiration of a predetermined time.

12 Claims, 9 Drawing Sheets

SEMICONDUCTOR MEMORY APPARATUS WHICH CAN EASILY ATTAIN REDUCTION OF ACCESS TIME

BACKGROUND OF THE INVENTION

1. Field of the Invention

The present invention relates to a semiconductor apparatus and a semiconductor memory apparatus. More particularly, the present invention relates to a semiconductor apparatus and a semiconductor memory apparatus which can easily attain a reduction of an access time.

2. Description of the Related Art

A conventional technique is described with reference to FIG. 1. FIG. 1 shows a schematic configuration of a circuit on a memory chip 10. The circuit of the memory chip 10 is an asynchronous type in which various signals are randomly inputted without a synchronization with a clock signal. A RAM core 12 in which memory cells are provided is mounted on the memory chip 10.

A plurality of control signals CE2, /CE1 (a bar of CE1), /LB (a bar of LB), /UB (a bar of UB), A1 and A0 which are used for selecting the memory cells are inputted from a plurality of pins (pads) Pd mounted on an outer circumference of the memory chip 10, respectively. Here, the control signal CE is a chip-enable signal to select the memory chip 10. The control signals A1, A0 are address signals to select bit lines of the memory cells in the RAM 12.

The memory cell is selected if all the plurality of control signals CE2, /CE1, /LB, /UB, A1 and A0 are at a selected state. If the memory cell is at a non-selected state, the memory chip 10 is designed such that a current does not flow through the memory chip 10, in order to reduce a consumptive electric power. Here, an order of a power cut logic at a first stage of input is the CE2 signal>the /CE1 signal>the /LB signal, the /UB signal>other input signals. That is, if the CE2 signal is at the non-selected state, a current does not flow through all paths in the memory chip 10 immediately at that time (whether or not other control signals including the /CE1 signal is at the selected state or at the non-selected state).

In a case of the configuration in FIG. 1, a read-out access worst path in which the access time for reading out the memory cell is the slowest is as follows.

CE2 Signal–Path (A)→Logic with /CE1 (OR Circuit 14)–Path (B)→Logic with /LB, /UB (OR Circuit 16)–Path (C)→Chip Underside Input Buffer 13.

Typically, in the memory chip 10, the Pads Pd are arranged on a top side and a bottom side of the memory chip 10, and the memory chip 10 is the chip longer in a longitudinal direction. Thus, this arrangement results in a problem of a signal transmission delay caused by long wirings (the paths (A), (B) and (C) between the top and bottom sides.

As mentioned above, since the delay amount (access time) of the CE2 signal becomes maximum, a speed derivation is limited. As a result of a simulation in 8 megabyte low power static random access memory (8MLPSRAM), although an access time of an Add (address) signal (the A0, A1 signals in FIG. 1) is 50 ns, an access time of the CE2 signal is 57 ns. Thus, this leads to an increase of 14%.

A long side 15 of the memory chip 10 is about 8 to 12 mm. As shown in FIG. 1, the CE2 signal passes through the long side 15 of the memory chip 10 three times, in the paths (A), (B) and (C). Correspondingly to it, the delay amount is larger, which causes an access performance of the signal in the CE system to be deteriorated.

By the way, the above-mentioned problems are common to memory apparatuses such as SRAM, a flash memory and the like. A semiconductor memory apparatus is desirable in which the access time is short.

Japanese Laid Open Patent Application (JP-A-Heisei, 8-102492) discloses a programmable wiring circuit as described below. This is provided with: input output terminals regularly arranged on a chip; input output lines respectively mounted in those input output terminals for sending and receiving a data between a wiring route within the chip and the input output terminals; a general wiring formed on the semiconductor chip so as to form any wiring route; a bypass wiring for bypassing the general wiring for each predetermined length; and wiring connection points composed of program elements arranged in a form of array at respective intersections of the input output lines, the general wiring and the bypass wiring for changing the connection conditions between each other to thereby control the wiring route.

SUMMARY OF THE INVENTION

The present invention is accomplished in view of the above mentioned problems. Therefore, an object of the present invention is to provide a semiconductor apparatus and a semiconductor memory apparatus which can easily attain a reduction of an access time.

In order to achieve an aspect of the present invention, a semiconductor apparatus, includes: an input unit inputting a first signal and a generation signal, the generation signal being generated based on the first signal and a second signal; and a control unit controlling the input unit such that one of the first signal and the generation signal is outputted, and wherein the input unit inputs the first signal prior to the generation signal, and wherein the control unit controls the input unit such that the generation signal instead of the first signal is outputted after an expiration of a predetermined time.

In this case, the control unit controls the input unit such that the first signal is outputted from the input unit until the generation signal is inputted to the input unit after the first signal is inputted to the input unit, and the generation signal instead of the first signal is outputted from the input unit when the generation signal is inputted to the input unit.

In order to achieve another aspect of the present invention, a semiconductor apparatus, includes: a delay unit outputting a first delay signal obtained by delaying a first signal by a predetermined delay amount; a control signal generating unit generating a control signal based on the first signal and the first delay signal; and a signal outputting unit inputting the first signal and a generation signal to output one of the first signal and the generation signal in response to the control signal, the generation signal being generated based on the first signal and a second signal.

In this case, the predetermined delay amount is a substantially identical with a time that elapsed before the generation signal is inputted to the signal outputting unit after the first signal is inputted to the signal outputting unit.

Also in this case, the predetermined delay amount is longer than a time that elapsed before the generation signal is inputted to the signal outputting unit after the first signal is inputted to the signal outputting unit.

Further in this case, the predetermined delay amount can be variably adjusted.

In this case, the signal outputting unit inputs the first signal prior to the generation signal and outputs the first signal until inputting the generation signal after inputting the first signal and outputs the generation signal instead of the first signal when inputting the generation signal.

Also in this case, the signal outputting unit inputs the first signal prior to the generation signal and outputs the first signal until inputting the generation signal after inputting the first signal and outputs the generation signal instead of the first signal when inputting the generation signal.

Further in this case, the signal outputting unit inputs the first signal prior to the generation signal and outputs the first signal until inputting the generation signal after inputting the first signal and outputs the generation signal instead of the first signal when inputting the generation signal.

In this case, the signal outputting unit inputs the first signal prior to the generation signal and outputs the first signal until inputting the generation signal after inputting the first signal and outputs the generation signal instead of the first signal when inputting the generation signal.

In order to achieve still another aspect of the present invention, a semiconductor apparatus, includes: a latch circuit latching a first signal to output the first signal as a second signal in response to a clock signal; a control signal generating unit generating a control signal based on the first signal and the second signal; and a signal outputting unit inputting the first and second signals to output one of the first and second signals in response to the control signal.

In order to achieve yet still another aspect of the present invention, a semiconductor apparatus, includes: a latch circuit latching a first signal to output the first signal as a second signal in response to a clock signal; a control signal generating unit generating a control signal based on the first signal and the clock signal; and a signal outputting unit inputting the first and second signals to output one of the first and second signals in response to the control signal.

In order to achieve still another aspect of the present invention, a semiconductor memory apparatus provided on a chip, includes: a memory cell array including a plurality of memory cells; and a selecting signal generating unit generating a selecting signal to select one of the plurality of memory cells, and wherein the selecting signal generating unit includes: a delay unit inputting a first signal from a first position of the chip to output a first delay signal obtained by delaying the first signal by a predetermined delay amount; a control signal generating unit inputting the first signal and the first delay signal to generate a control signal based on the first signal and the first delay signal; and a signal outputting unit inputting the first signal and a generation signal to output one of the first signal and the generation signal as the selecting signal in response to the control signal, wherein the generation signal is generated based on the first signal and a second signal, the second signal being inputted from a second position of the chip.

In this case, the predetermined delay amount is a substantially identical with a time that elapsed before the generation signal is inputted to the signal outputting unit after the first signal is inputted to the signal outputting unit.

Also in this case, the predetermined delay amount is longer than a time that elapsed before the generation signal is inputted to the signal outputting unit after the first signal is inputted to the signal outputting unit.

Further in this case, the predetermined delay amount can be variably adjusted.

In this case, the predetermined delay amount corresponds to a signal transmission delay resulted from a wiring provided between the first and second positions.

Also in this case, a logic operation is performed on the first and second signals to generate the generation signal, and wherein the predetermined delay amount corresponds to a logic delay when the logic operation is performed.

Further in this case, the delay unit is constituted by a long wiring.

In this case, the delay unit is constituted by a long wiring provided between the first and second positions.

DESCRIPTION OF THE PREFERRED EMBODIMENTS

An embodiment of a semiconductor memory apparatus in the present invention will be described below in detail with reference to the attached drawings.

Figure 1:
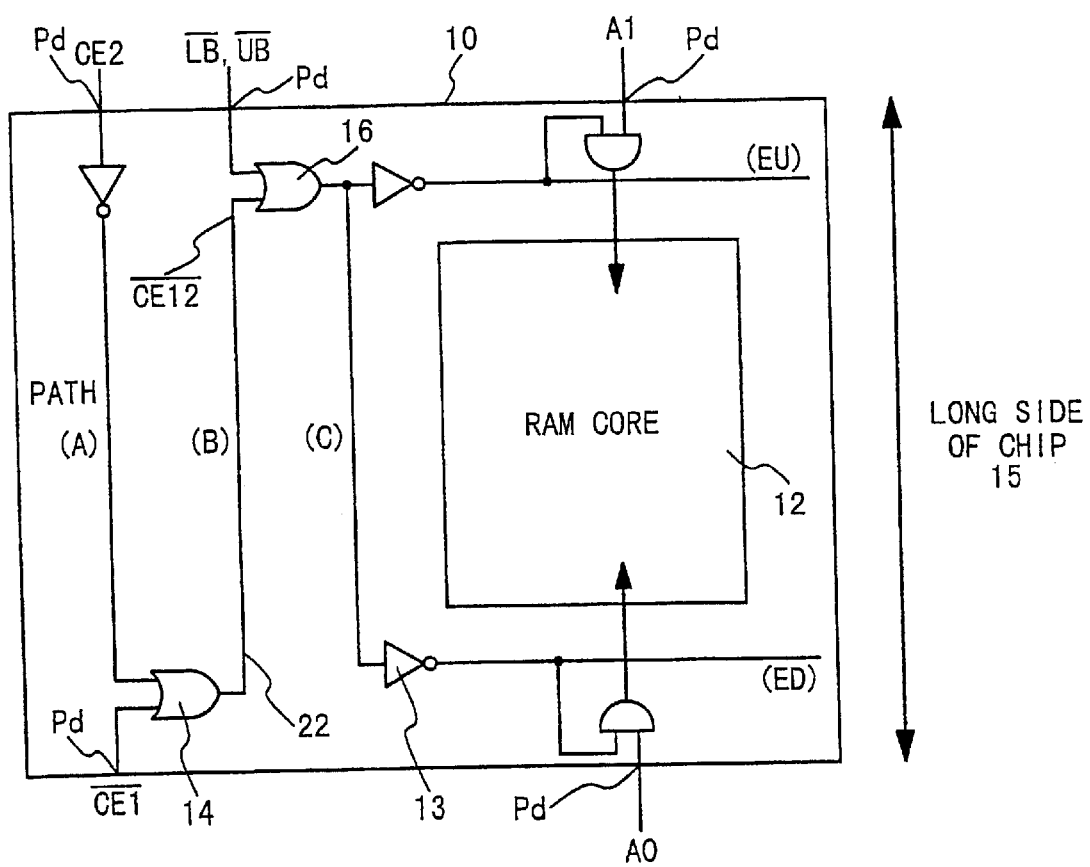
FIG. 1 is a layout view showing problems of a conventional semiconductor apparatus.
Figure 2:
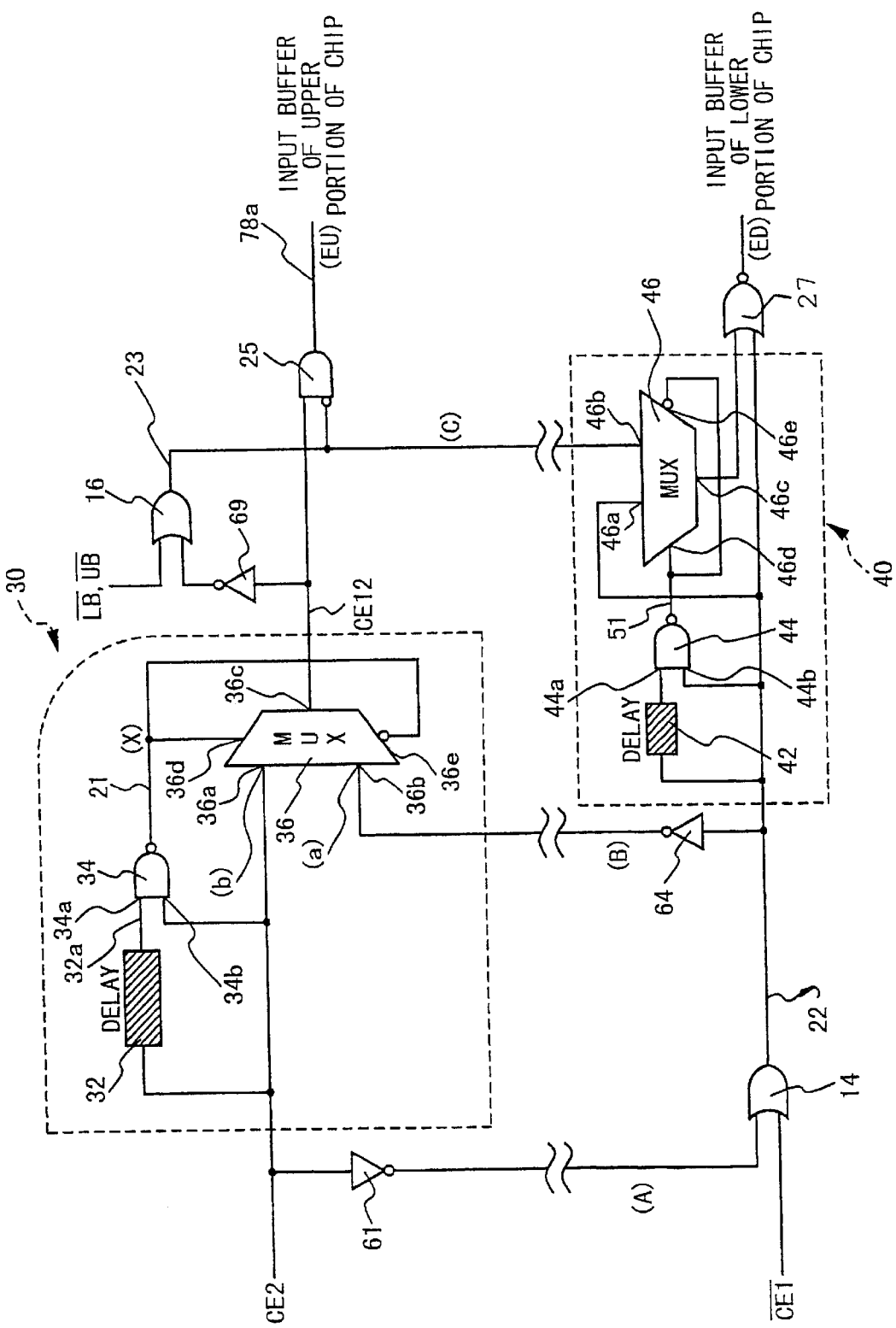
FIG. 2 is a circuit diagram showing a configuration of a first embodiment of a semiconductor apparatus in the present invention.

FIG. 2 is a view showing a part of a configuration of a first embodiment in the present invention. FIG. 2 shows a stage prior to an address signal input section (the RAM core 12) in the memory chip 10 shown in FIG. 1 (refer to wirings (EU), (ED)). In FIG. 2, the same symbols are given to members equal to those of FIG. 1, and the explanations are omitted. This embodiment has an asynchronous circuit similar to that in the circuit configuration shown in FIG. 1.

In this embodiment, bypass circuits 30, 40 are mounted as shown in FIG. 2. At first, the bypass circuit 30 is described.

The bypass circuit 30 is mounted for the CE2 signal having the maximum access time. The bypass circuit 30 is provided with a delay circuit 32, a NAND circuit 34 and a multiplexer (data selector or multiplexing unit) 36.

The bypass circuit 30 is mounted between an input section of the CE2 signal and a logic operator (OR circuit 16) which performs a logic operation with the /LB signal and the /UB signal.

The delay circuit 32 inputs a CE2 signal which is not passed through a path (A), and delays the inputted CE2 signal by a predetermined time to output as an output signal 32a. The delay circuit 32 delays the signal inputted to the delay circuit 32 by a time corresponding to the signal transmission delays (signal transmission delays corresponding to two long sides of the chip 10) in the paths (A), (B) to output as the output signal 32a. The predetermined time can be variably set.

The NAND circuit 34 is provided with a first input section 34a and a second input section 34b. The NAND circuit 34 inputs the output signal 32a from the delay circuit 32 at the first input section 34a, and inputs the CE2 signal that is not passed through the path (A) at the second input section 34b to output a signal 21 in which the NAND logic between those inputted two signals 32a, CE2 are carried out.

The multiplexer 36 has two input sections 36a, 36b, two selecting signal input sections 36d, 36e and an output section 36c. The multiplexer 36 outputs any one of the signals respectively inputted from the two input sections 36a, 36b, from the output section 36c, in response to the signals respectively inputted from the two selecting signal input sections 36d, 36e. Here, the respective numbers of input sections and selecting signal input sections in the multiplexer 36 are described as 2. However, the number may be three or more.

The output signal 21 outputted from the NAND circuit 34 is inputted to the selecting signal input section 36d, as a selecting signal for selecting and outputting the signal inputted to the first input section 36a.

A signal in which a polarity of the output signal 21 from the NAND circuit 34 is inverted is inputted to the selecting signal input section 36e, as a selecting signal for selecting and outputting the signal inputted to the second input section 36b.

The CE2 signal is outputted as a CE12 signal from the bypass circuit 30 (the output section 36c) before an elapse of a time while an inversion signal of the CE2 signal is transmitted through the path (A) and then an OR logic signal 22 indicative of a result of a logic between the inversion signal of the CE2 signal and the /CE1 signal (OR logic through the OR circuit 14) is inverted to be transmitted through the path (B) and inputted to the second input section 36b.

As a result, when the CE2 signal is selected, a wiring (EU) is selected immediately and transiently without the addition of the signal transmission delay of the path (A), the logic delay in the OR circuit 14 and the signal transmission delay of the path (B).

After that, when the inversion signal of the OR logic signal 22 is inputted through the path (B) to the second input section 36b, the bypass circuit 30 is switched to the second input section (normal logic path) 36b to output the inversion signal of the OR logic signal 22 as the CE12 signal.

Accordingly, when the CE2 signal is selected, the wiring (EU) is selected before the additions of the signal delays of the paths (A), (B) along the long sides of the chip and the logic delay in the OR circuit 14. Thus, the access time is made shorter.

A bypass circuit 40 will be described below.

As shown in FIG. 2, the bypass circuit 40 is mounted for the /CE1 signal having the next longest access time next after the CE2 signal.

The bypass circuit 40 includes a delay circuit 42, a NAND circuit 44 and a multiplexer (data selector or multiplexing unit) 46.

The bypass circuit 40 is mounted between an output section of the OR circuit 14 and the wiring (ED).

The delay circuit 42 inputs the OR logic signal 22, and then delays the inputted OR logic signal 22 by a predetermined time to output. The delay circuit 42 delays the signal inputted to the delay circuit 42 by a time corresponding to the signal transmission delays (signal transmission delays corresponding to the two long sides of the chip 10) in the paths (B), (C) to output. The predetermined time can be variably set.

The NAND circuit 44 is provided with a first input section 44a and a second input section 44b. The NAND circuit 44 inputs the signal outputted from the delay circuit 42 at the first input section 44a, and inputs the OR logic signal 22 at the second input section 44b to output a signal 51 in which the NAND logic between those inputted two signals are carried out.

The multiplexer 46 has two (plural) input sections 46a, 46b, two (plural) selecting signal input sections 46d, 46e and an output section 46c. The multiplexer 46 outputs any one of the signals respectively inputted from the two input sections 46a, 46b, from the output section 46c, in response to the signals respectively inputted from the two selecting signal input sections 46d, 46e.

The output signal 51 outputted from the NAND circuit 44 is inputted to the selecting signal input section 46d, as a selecting signal for selecting and outputting the signal inputted to the first input section 46a.

A signal in which a polarity of the output signal 51 from the NAND circuit 44 is inverted is inputted to the selecting signal input section 46e, as a selecting signal for selecting and outputting the signal inputted to the second input section 46b.

The inversion signal of the OR logic signal 22 is outputted from the bypass circuit 40 (the output section 46c), before an elapse of a time while the inversion signal of the OR logic signal 22 is transmitted through the path (B) and outputted from the multiplexer 36 as the CE12 signal, and after that, an OR logic signal 23 between a signal generated by inverting the inversion signal of the OR logic signal 22 through an inverter 69 and the /LB or the /UB signal is transmitted through a path (C) to be inputted to the second input section 46b.

As a result, when the /CE1 signal is selected, the wiring (ED) is selected immediately and transiently so that the /CE1 signal is transmitted through NOR gate 27 without the addition of the signal transmission delay of the path (B), the logic delay in the OR circuit 16 and the signal transmission delay of the path (C).

After that, when the OR logic signal 23 is inputted through the path (C) to the second input section 46b, the bypass circuit 40 is switched to the second input section (normal logic path) 46b, and outputs the OR logic signal 23.

Accordingly, when the /CE1 signal is selected, the wiring (ED) is selected before the additions of the signal delays of the paths (B), (C) along the long sides of the chip 10 and the logic delay in the OR circuit 16. Thus, the access time is made shorter.

As mentioned above, the bypass circuits 30, 40 are respectively mounted on the top and bottom sides of the memory chip 10 to thereby cancel out the signal transmission delays (moreover, the logic delays) in the paths (A), (B) and (C) along the long sides of the chip 10 when the CE system signals are selected. Thus, the access time is made faster by about 10% than that of the circuit configuration of FIG. 1 (from the simulation of 8MLPSRAM).

The operations in this embodiment will be described below with reference to FIGS. 3 and 4.

Figure 3:
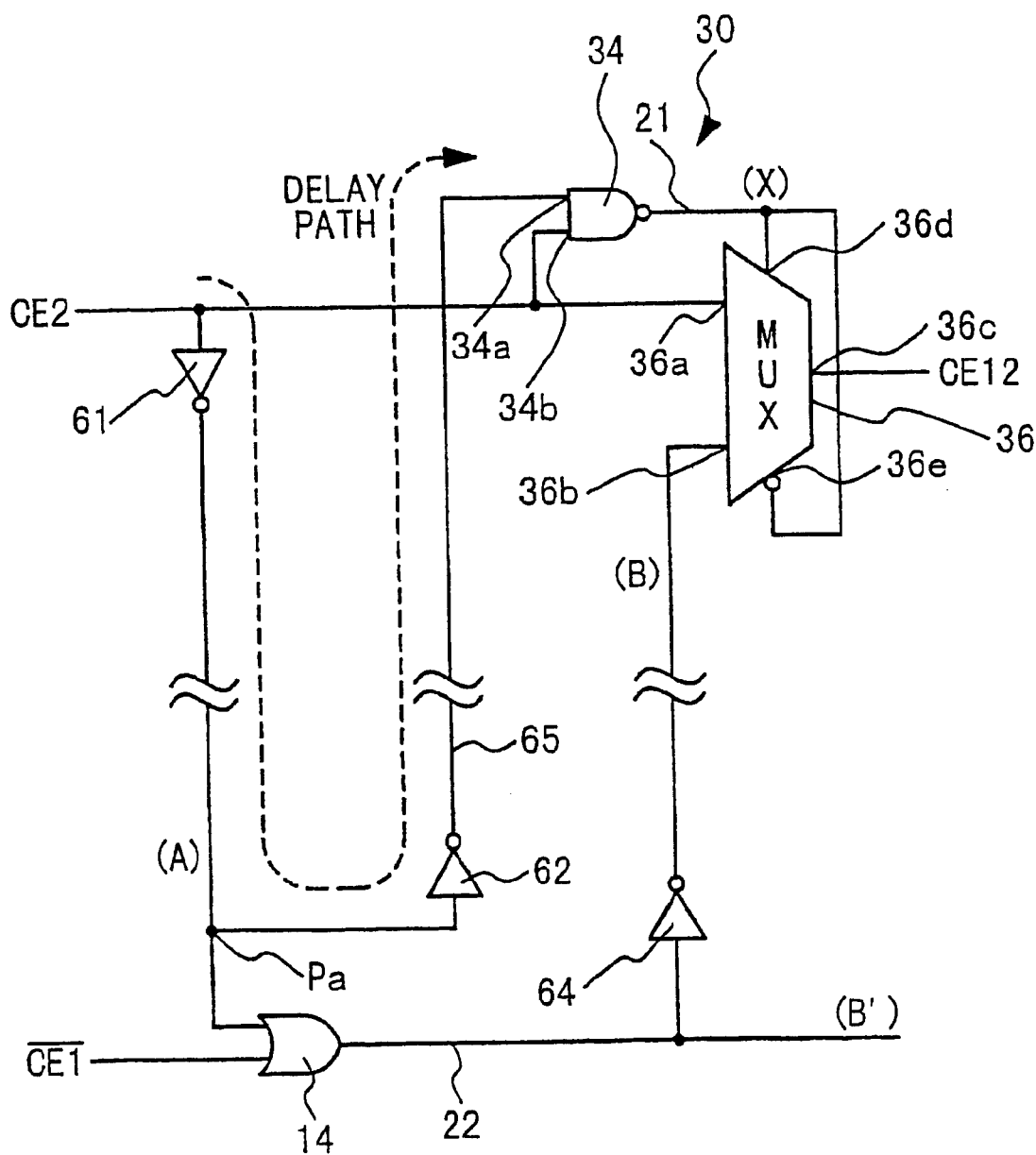
FIG. 3 is a circuit diagram showing a configuration of a variation of a part of the first embodiment.

FIG. 3 shows a variation of the bypass circuit 30 shown in FIG. 2. In FIG. 3, the same symbols are given to the members identical to those of FIG. 2, and the explanations thereof are omitted. The variation in FIG. 3 is designed such that the configuration of the delay circuit 32 of FIG. 2 is changed.

A delay path shown by a dashed line in FIG. 3 is equivalent to the delay circuit 32 shown in FIG. 2, with regard to the delay time. The delay path includes a wiring 65. The wiring 65 is mounted with a branch point Pa near an end of the path (A) as a start point and with the first input section 34a as an final point. Then, an inverter 62 is mounted between them.

As mentioned above, the delay circuit 32 has the delay amount corresponding to the signal transmission delays (the signal transmission delays corresponding to the two long sides of the chip 10) in the paths (A), (B). A wiring length of the delay path is substantially equal to the wiring lengths of the paths (A), (B). Thus, the delay path has the delay amount substantially equal to that of the delay circuit 32.

Figure 4:
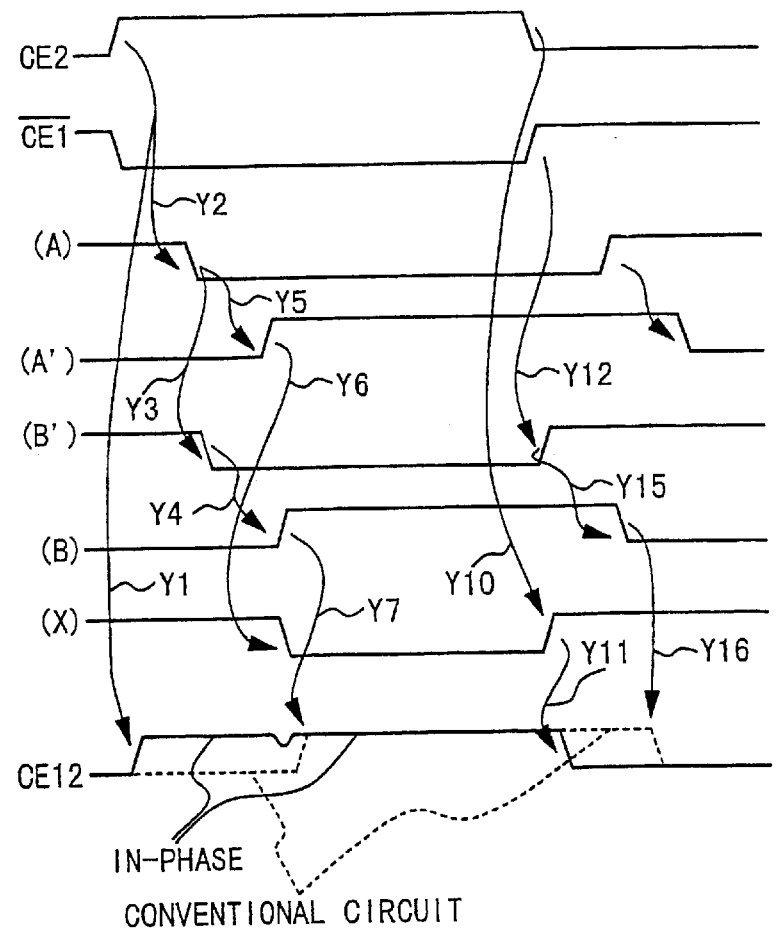
FIG. 4A is a timing chart showing a change of a signal at a node of the circuit in FIG. 3.
FIG. 4B is a timing chart showing a change of a signal at another node of the circuit in FIG. 3.
FIG. 4C is a timing chart showing a change of a signal at still another node of the circuit in FIG. 3.
FIG. 4D is a timing chart showing a change of a signal at yet still another node of the circuit in FIG. 3.
FIG. 4E is a timing chart showing a change of a signal at still another node of the circuit in FIG. 3.
FIG. 4F is a timing chart showing a change of a signal at still another node of the circuit in FIG. 3.
FIG. 4G is a timing chart showing a change of a signal at still another node of the circuit in FIG. 3.
FIG. 4H is a timing chart showing a change of a signal at still another node of the circuit in FIG. 3.

As shown in FIG. 4, the CE2 signal is at a low (non-selected) state in an initial state. Thus, an (X) signal (a NAND logic signal 21) outputted from the NAND circuit 34 is high. Accordingly, the high signal is inputted to the selecting signal input section 36d to thereby make the input section 36a opened, and the low signal is inputted to the selecting signal input section 36e to thereby make the input section 36b closed. Thus, the CE2 signal at the low state is outputted through the input section 36a as the CE12 signal.

At first, the case is described in which the CE2 signal becomes at a high (selected) state.

When the CE2 signal becomes at the high state, the high signal is outputted from the output section 36c through the input section 36a at the open state to thereby make the CE12 signal high (refer to an arrow Y1, Bypass State). Accordingly, the selected state of the CE2 signal is quickly transmitted as the CE12 signal without the addition of the signal transmission delays in the paths (A), (B) (and the logic delay in the OR circuit 14). Thus, the speed in the memory access can be made faster. This is one of the merits in this embodiment.

On the other hand, the CE2 signal at the high state is inverted through an inverter 61. Also, the signal transmission delay in the path (A) is added thereto, and an (A) signal is trailed down (refer to an arrow Y2). Here, the (A) signal is a signal at the branch point Pa.

At this time, as shown in FIG. 4, in a case that the /CE1 signal is at the low (selected) state, the OR logic signal 22 ((B') signal) becomes low (refer to an arrow Y3). The (B') signal at the low state is inverted by an inverter 64, and the signal transmission delay in the path (B) is added thereto. The (B') signal becomes a (B) signal at the high state (refer to an arrow Y4). Here, the (B) signal is a signal at the input section 36b.

The (A) signal at the low state is inverted by the inverter 62, and the signal transmission delay in the path (B) is added thereto. An (A') signal is risen up (refer to an arrow Y5). Here, the (A') signal is a signal at the first input section 34a. The signal transmission delay in the path (A) and the signal transmission delay in the path (B) are added to the signal (A') signal, as compared with the CE2 signal at the input time, and its polarity is the same.

When the (A') signal at the high state is inputted to the first input section 34a, the NAND logic is carried out between it and the CE2 signal at the high state inputted from the second input section 34b. As a result, the NAND logic signal 21 ((X) signal) at the low state is generated (refer to an arrow Y6). At this time, the selecting signal input section 36d receives the low signal ((X) signal) so that the input section 36a becomes at a close state. The selecting signal input section 36e receives the inverted high signal so that the input section 36b becomes at an open state. Accordingly, the (B) signal at the high state is outputted from the output section 36c so that the CE12 signal becomes high (refer to an arrow Y7). The (B) signal outputted at this time is the signal on which the originally normal logic operation (14) is performed (similarly to the circuit configuration of FIG. 1).

In the circuit configuration shown in FIG. 1, after the input of the CE2 signal at the high state, the CE12 signal becomes at the high state only after the additions of the signal transmission delay in the path (A) and the signal transmission delay in the path (B) (refer to the dashed line corresponding to a tip of the arrow Y7). On the contrary, in this embodiment, if the CE2 signal at the high state is inputted, the CE12 signal becomes immediately at the high state (refer to the arrow Y1) without the additions of the signal transmission delay in the path (A) or the signal transmission delay in the path (B) (further, the logic delay in the OR circuit 14). Thus, this contributes to the reduction of the access time in the memory cell.

As mentioned above, the operation for switching from the condition that the input section 36a is open and the input section 36b is close to the condition that the input section 36a is close and the input section 36b is open is done after a predetermined time after the CE2 signal is changed from the non-selected state to the selected state (when the inversion signal of the OR logic signal 22 is inputted to the input section 36b ) (refer to the arrows Y2, Y5 and Y6).

The case in which the CE2 signal is at the high (selected) state and the /CE1 signal is at the high (non-selected) state will be described below (not shown in FIG. 4). At this time, the operations denoted by the arrows Y1, Y2, Y5 and Y6 of FIG. 4 are equal to those in the above-mentioned descriptions. When the /CE1 signal is at the non-selected state, the (B') signal (22) becomes at the high state, differently from the operation denoted by the arrow Y3. Thus, if the input section 36a becomes at the close state and the input section 36b becomes at the open state (normal path) when the operation denoted by the arrow Y6 is done, the (B') signal at the high state is inverted by the inverter 64. So, the (B) signal at the low state to which the signal transmission delay in the path (B) is added is outputted from the output section 36c so that the CE12 signal becomes low. In this way, the /CE1 signal at the non-selected state has influence on the CE12 signal so that the CE12 signal becomes low. Hence, the power cut in future can be attained.

Here, the (B) signal at the low state outputted as the CE12 signal at this time is the signal on which the originally normal logic operation (14) is performed (similarly to the circuit configuration of FIG. 1).

In this case, in the period until the originally normal (B) signal is outputted as the CE12 signal (the period until the state that the input section 36a is open and the input section 36b is close is switched to the state that the input section 36a is close and the input section 36b is open (the above-mentioned normal path), the operation denoted by the arrow Y1 enables a signal (the CE2 signal at the high state) having a polarity different from that of the originally normal (B) signal to be outputted as the CE12 signal.

As described in this embodiment, even if the signal having the polarity different from that of the original signal is transmitted in the period until this open/close state is switched to that of the normal path, it can be sufficiently coped with by using a countermeasure in which a noise sensibility is dropped to the extent that an erroneous operation can be protected against noise. Its countermeasure is conventionally typically done at a latter stage in this embodiment (a latter stage in the address input section) in the memory chip.

Thus, from the viewpoint of the entire memory chip to which this embodiment is applied, the conventional typical circuit design technique can usually avoid the erroneous operation of reading and writing a data in accordance with a signal in which a pulse width before the switching to the normal path is shorter than a predetermined width.

The case in which the CE2 signal becomes at the low (non-selected) state will be described below with reference to FIG. 4.

When the CE2 signal becomes low (when it is inputted to the second input section 34b), the (X) signal (NAND logic signal 21) becomes high (refer to an arrow Y10) without the necessity of waiting for the input from the first input section 34 a of the (A') signal containing the wiring delays in the paths (A), (B). Thus, the input section 36a becomes high, and the CE2 signal at the low state is outputted through the input section 36a as the CE12 signal (refer to an arrow Y11).

As mentioned above, the CE2 signal at the non-selected state is reflected so that the CE12 signal becomes low immediately. This enables the power cut after that. Hence, the power cut is already attained as denoted by the arrow Y11, without the necessity that the input section 36b is made open after waiting for the input to the first input section 34a of the (A') signal and then the original (B) signal is outputted as the output signal 21.

As mentioned above, the operation for switching from the condition that the input section 36a is close and the input section 36b is open to the condition that the input section 36a is open and the input section 36b is close is done at the same time when the CE2 signal is changed from the selected state to the non-selected state (refer to the arrow Y10).

Moreover, the OR logic signal 22 ((B') signal) becomes high (refer to an arrow Y12) in a case that the /CE1 signal is at the high (non-selected) state, in addition to the fact that the CE2 signal is at the low (non-selected) state. Then, the high OR logic signal 22 is inverted and made low by the inverter 64. The signal transmission delay in the path (B) is added thereto, and the (B) signal at the low state is generated (refer to an arrow Y15).

In the circuit configuration shown in FIG. 1, even if the CE2 signal is at the low (non-selected) state, the logic between it and the /CE1 signal at the high (non-selected) state is carried out. Then, only after the signal transmission delays in the paths (A), (B), the (B) signal at the low state is outputted as the CE12 signal (refer to the dashed line denoted at a tip of the arrow Y16).

As mentioned above, the memory cell is selected when all the control signals including the CE2 signal, the /CE1 signal, the /LB signal, the /UB signal, the A1 signal and the A0 signal are at the selected state. Thus, for example, if the CE2 signal is at the selected state and the /CE1 signal is at the non-selected state, the memory cell must not be originally selected.

Nevertheless, according to this embodiment, the wiring (EU) is transiently selected only based on the fact that the CE2 signal is at the selected state (although after that, the wiring (EU) becomes at the non-selected state when the inversion signal of the OR logic signal 22 between the CE2 signal and the /CE1 signal at the non-selected state is outputted as the CE12 signal).

As described in the above-mentioned case, if the wiring (EU) is transiently selected and the period in the selected state at that time is shorter than the period corresponding to the original (normal) selected state, a memory on which a conventionally typical product design is performed is designed such that it is recognized as a middle stage in a state-change at a latter stage of this embodiment in the memory and the erroneous operation is never induced as the entire memory. Thus, the execution of the operation in this embodiment (a prior selection as a bypass of the logic operation in the OR circuit 14) never causes the problem of the erroneous operation as the entire memory.

From the viewpoint of the above-mentioned explanation, if the delay amount caused by the wiring 65 or the delay circuit 32 is too large, there may be the fear that a period (a period until the execution of the operation denoted by the arrow Y6 after the execution of the operation denoted by the arrow Y1) while the wiring (EU) is selected by the CE2 signal (the signal inputted to the second input section 34b on which the logic operation between it and the /CE1 signal is not performed) bypassing the bypass circuit 30 is made longer to thereby disable a discrimination from the period corresponding to the original selected state. Thus, it is necessary that the delay amount caused by the wiring 65 or the delay circuit 32 is reduced to a small value to the extent that the discrimination can be done.

Figure 5:
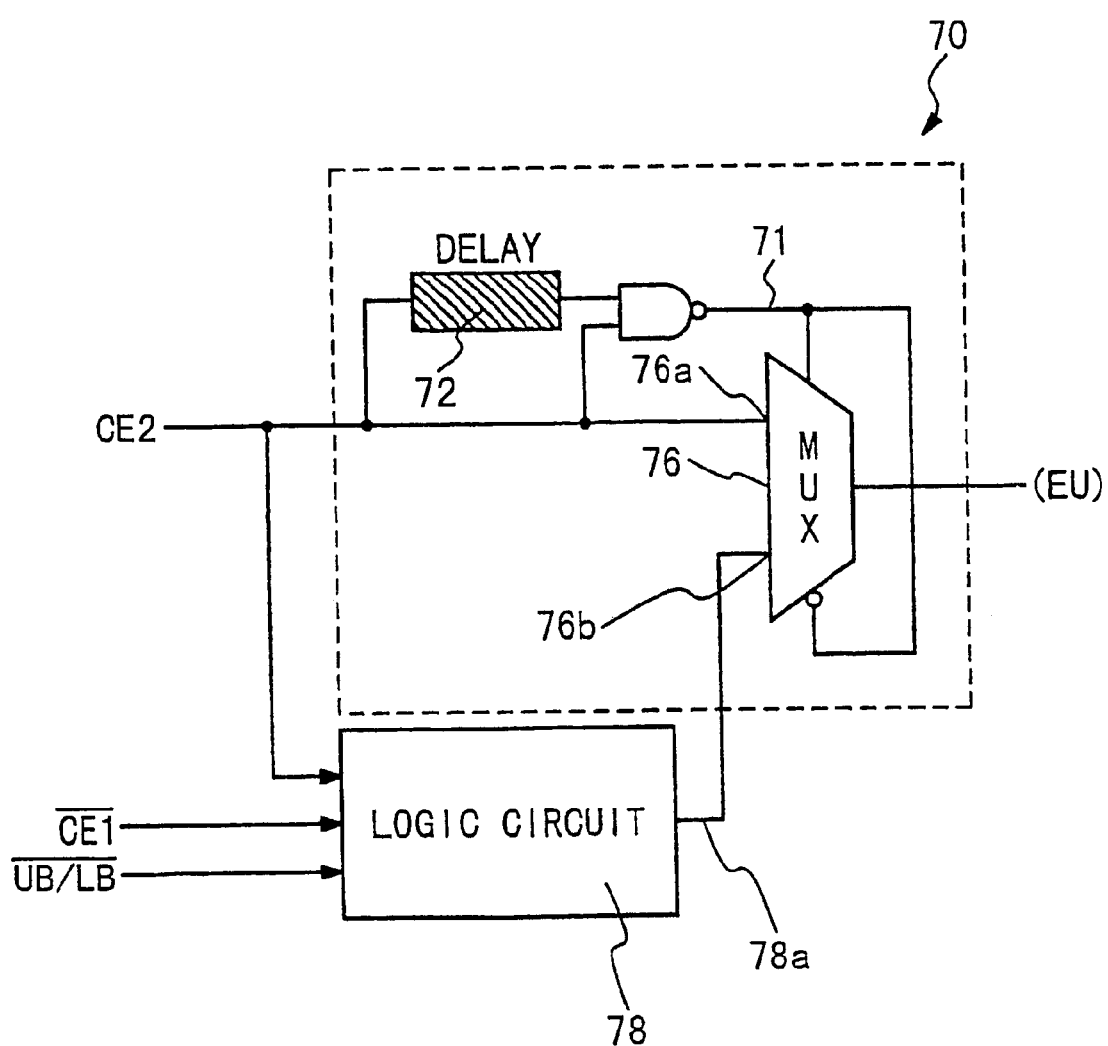
FIG. 5 is a circuit diagram showing a configuration of a second embodiment of a semiconductor apparatus in the present invention.

A second embodiment will be described below with reference to FIG. 5.

In the second embodiment, a portion including the bypass circuit 30 and the OR circuit 16 and an AND circuit 25 to which the output signal 23 of the OR circuit 16 and the CE12 signal are inputted as shown in FIG. 2 is configured as a logic circuit 78. A bypass circuit 70 is mounted for bypassing the logic circuit 78 and directly transmitting the CE2 signal to the wiring (EU). A multiplexer 76 in the bypass circuit 70 selectively switches between an output signal 78a from the logic circuit 78 which is received at a second input section 76b (refer to FIG. 2 and FIG. 5) and a CE2 signal received at a first input section 76a which is not passed through the logic circuit 78, to output it.

A delay circuit 72 in the bypass circuit 70 delays the CE2 signal outputted as output signal 71 by a predetermined time to output. Here, the predetermined time can be variably adjusted. In this embodiment, the predetermined time is set as a time including a signal transmission delay until the CE2 signal is inputted to the logic circuit 78, a signal transmission delay within the logic circuit 78, a logic delay in the logic circuit 78, and a signal transmission delay until the output signal 78a from the logic circuit 78 is inputted to the second input section 76b.

Figure 6:
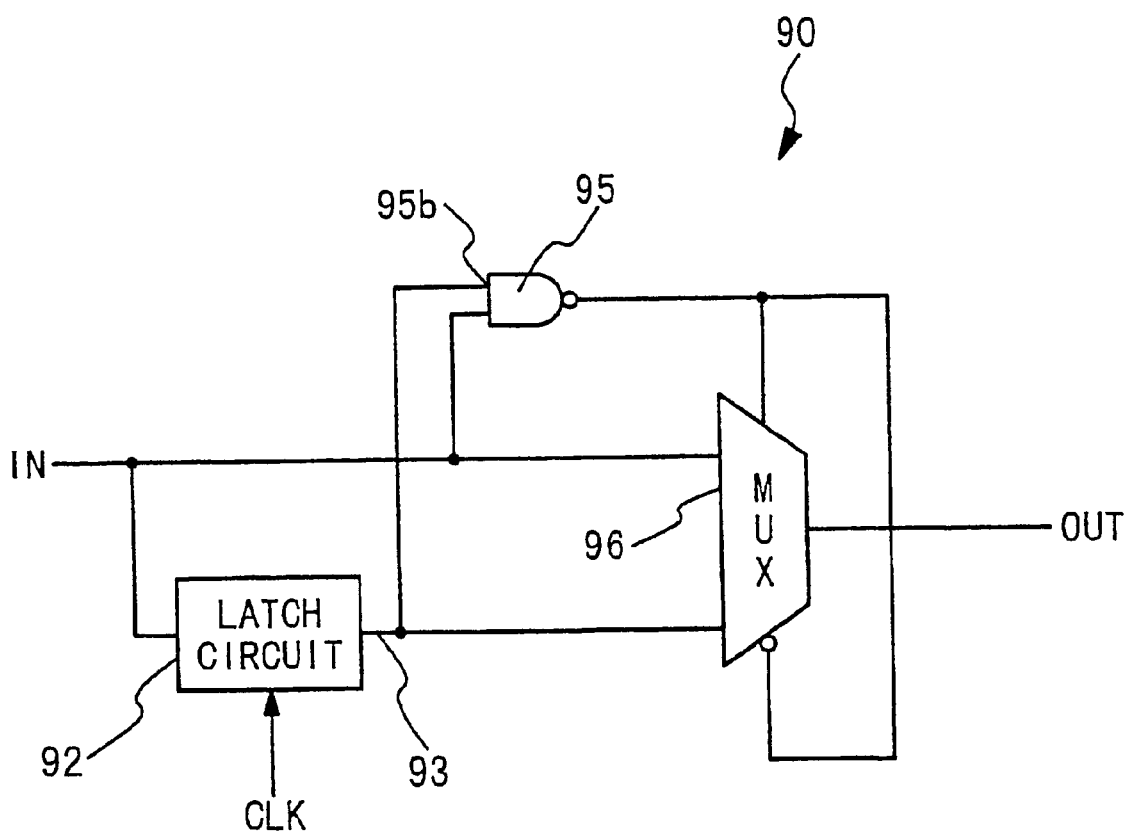
FIG. 6 is a circuit diagram showing a configuration of a third embodiment of a semiconductor apparatus in the present invention.

A third embodiment will be described below with reference to FIG. 6.

A bypass circuit 90 in the third embodiment is applied to a latch circuit 92. The bypass circuit 90 is provided with a NAND circuit 95 and a multiplexer 96. The latch circuit 92 latches an input signal IN to output the latched signal as an output signal 93 in response to a clock signal CLK.

In the third embodiment, until the clock signal CLK is inputted to the latch circuit 92 and then the latch circuit 92 outputs the output signal 93, the input signal IN is outputted in its original state as an OUT signal (the bypass of the latch circuit 92) without latched by the latch circuit 92.

When the output signal 93 is inputted to a second input section 95b in the NAND circuit 95, the multiplexer 96 is switched such that the output signal 93 is outputted as the OUT signal.

A timing when the output signal 93 is inputted to the second input section 95b (the switching timing of the multiplexer 96) includes a time of waiting for an input of the clock signal CLK to the latch circuit 92, and a signal transmission delay and a logic delay within the latch circuit 92.

This embodiment is effective if the latch circuit 92 has a plurality of logic circuits in addition to the original latch circuit. This embodiment can use another synchronous circuit, instead of the latch circuit.

Figure 7:
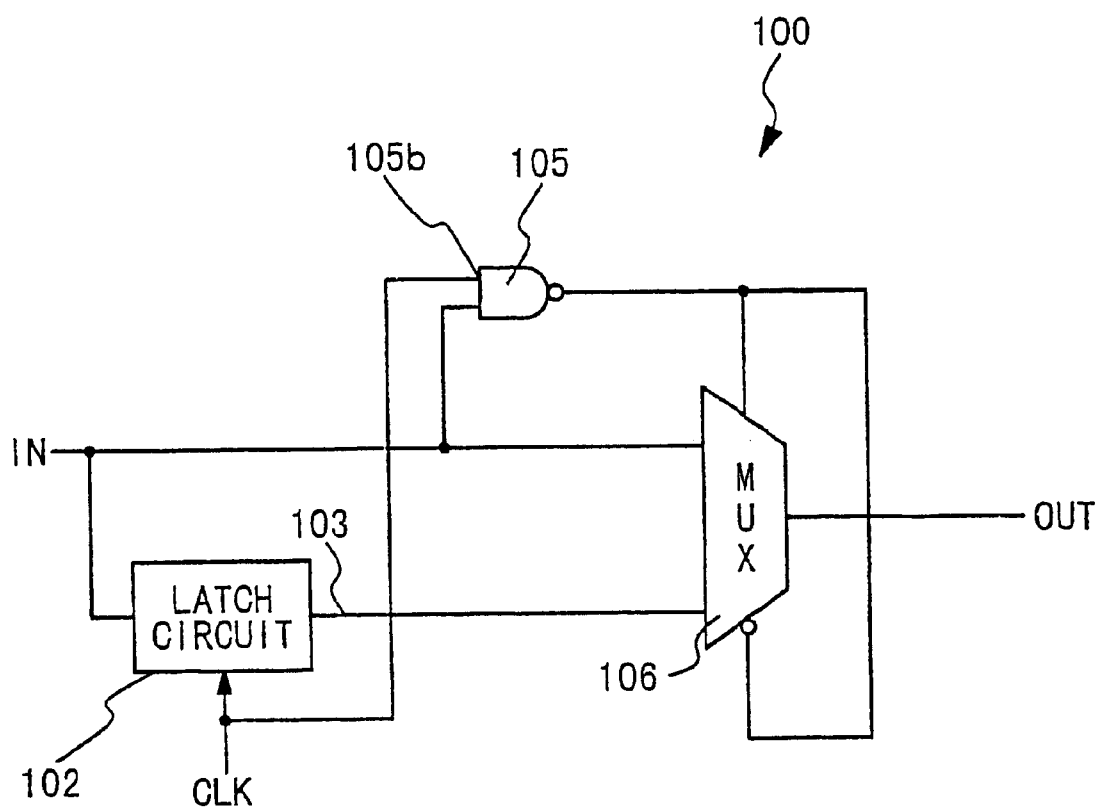
FIG. 7 is a circuit diagram showing a configuration of a fourth embodiment of a semiconductor apparatus in the present invention.

A fourth embodiment will be described below with reference to FIG. 7.

A bypass circuit 100 in the fourth embodiment is provided with a NAND circuit 105 and a multiplexer 106. The fourth embodiment is also applied to a latch circuit 102, similarly to the third embodiment. In this embodiment, a clock signal CLK inputted to the latch circuit 102 is inputted in its original state to a second input section 105b of the NAND circuit 105.

In the fourth embodiment, until the clock signal CLK is inputted to the latch circuit 102 and the NAND circuit 105, an IN signal is outputted in its original state as an OUT signal without latched by the latch circuit 102. When the clock signal CLK is inputted to the latch circuit 102, the multiplexer 106 is switched substantially simultaneous with the input, and an output signal 103 from the latch circuit 102 is outputted as the OUT signal.

A fifth embodiment will be described below with reference to FIG. 8.

In the fifth embodiment, a synchronous logic circuit 178 is applied instead of the asynchronous logic circuit 78 (refer to FIG. 5) in the second embodiment. The logic circuit 178 has a latch circuit (not shown) as the synchronous circuit. Signals (a CE2 signal, a /CE1 signal, a /UB signal and a /LB signal) inputted to the latch circuit is outputted from the latch circuit, in response to a clock signal CLK.

As mentioned above, in the typical latch circuit, the signal is usually outputted from the latch circuit in response to an input timing of the clock signal CLK. On the contrary, in the fifth embodiment, the specific signal (CE2 signal) among the plurality of signals CE2, /CE1, /UB and /LB inputted to the logic circuit 178 is passed through a bypass circuit 170. Thus, the CE2 signal is immediately outputted to a wiring (EU) without being inputted to the latch circuit (without the restriction on the input timing of the clock signal CLK).

After that, when a signal 178a (a logic output signal passed through the latch circuit), outputted from the logic circuit 178, which reflects the input timing of the clock signal CLK reaches an input section 176b of a multiplexer 176, the multiplexer 176 switches from the CE2 signal to the logic output signal 178a to output.

Thus, a delay circuit 172 for determining the timing of the switching to the logic output signal 178a adds a delay amount, which reflects the input timing of the clock signal CLK, to the signal inputted to the delay circuit 172, and outputs it.

Here, it is necessary that the delay amount in the delay circuit 172 includes not only the delay amount corresponding to the input timing of the clock signal CLK, but also the signal transmission delay caused by a wiring length until the CE2 signal is inputted to the logic circuit 178 and a wiring length within the logic circuit 178 after the input, and the logic delay between the CE2 signal, the /CE1 signal, the /UB signal and the /LB signal.

In the asynchronous circuit such as the first embodiment, the delay amount necessary for the delay circuit 32 is determined uniquely (as a predetermined fixed value). Thus, the delay circuit 32 can be constituted in a sequential circuit. Hence, it is not necessary to control the delay amount each time.

On the contrary, in the synchronous circuit 178 such as the fifth embodiment, the delay amount necessary for the delay circuit 172 is not determined uniquely, and it is changed on the basis of the input timing of the clock signal CLK. This is because the timing when the logic output signal 178a reaches the input section 176b is changed on the basis of the input timing of the clock signal CLK. Thus, the output signal 172a of the delay circuit 172 (or, the signal 171 for switching the multiplexer 176 that is generated on the basis of the output signal 172a) must include an information with regard to the clock signal CLK. Accordingly, as shown in FIG. 8, the delay circuit 172 receives the clock signal CLK to generate the delay having the necessary amount, based on the clock signal CLK.

Figure 9:
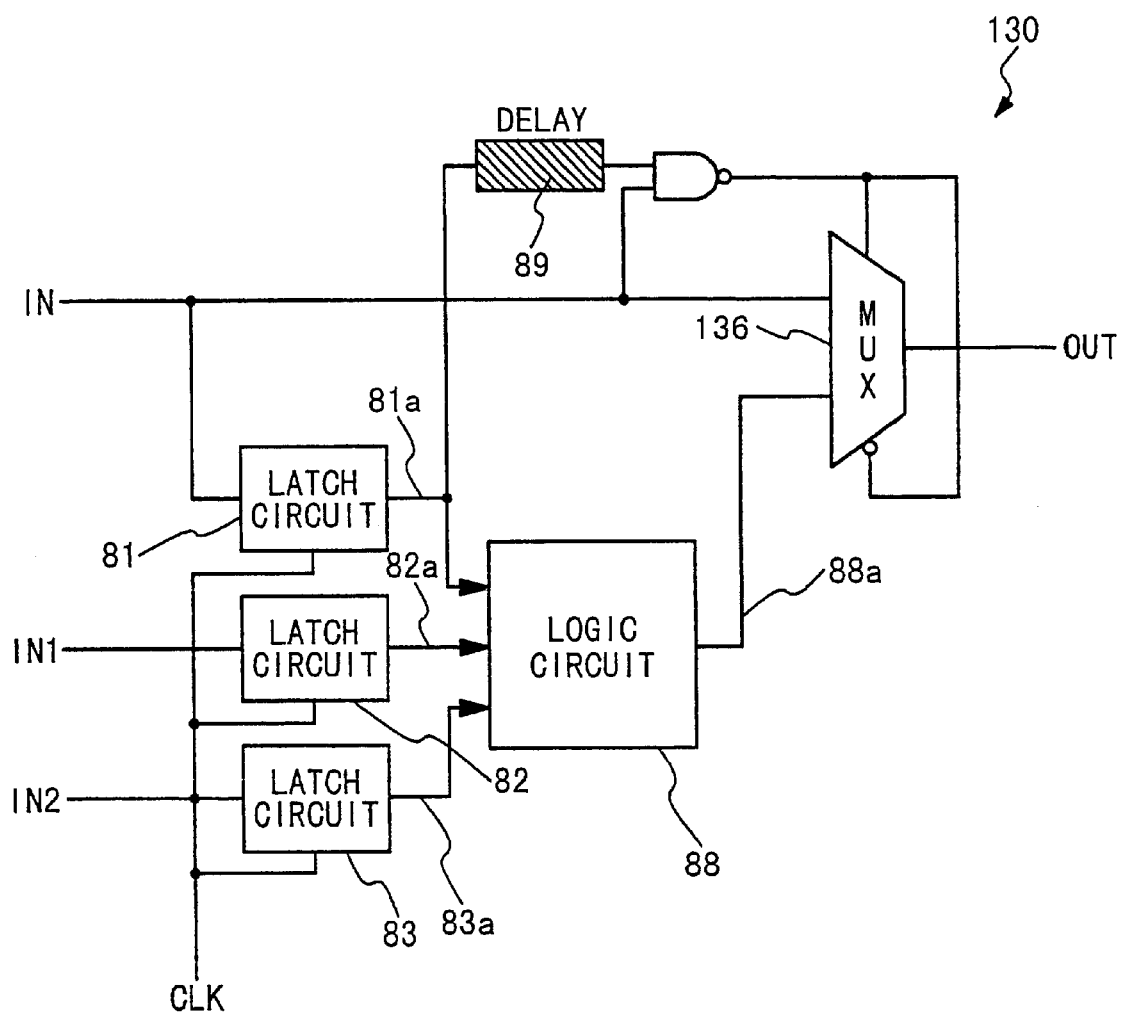
FIG. 9 is a circuit diagram showing a configuration of a sixth embodiment of a semiconductor apparatus in the present invention.

A sixth embodiment will be described below with reference to FIG. 9. A bypass circuit 130 in the sixth embodiment is constituted by the combination of the second embodiment shown in FIG. 3 and the third embodiment shown in FIG. 6.

Latch circuits 81, 82 and 83 for respectively latching a plurality of input signals IN, IN1 and IN2 are mounted in former stages of a logic circuit 88. Accordingly, the control of inner timings in the logic circuit 88 is done synchronously with the clock signal CLK.

The logic circuit 88 receives signals 81a, 82a and 83a respectively outputted from the plurality of latch circuits 81, 82 and 83 in response to the clock signal CLK, at the same time, to output an output signal 88a generated by a logic operation between those three input signals 81a, 82a and 83a. Thus, the logic circuit 88 is driven synchronously with the clock signal CLK.

The input signal IN is not latched by the latch circuit 81 (without the synchronization with the clock signal CLK), and it is inputted to the bypass circuit 130, and outputted in its original state as an OUT signal through the multiplexer 136. After that, when the clock signal CLK is inputted, the signal 81a outputted from the latch circuit 81 in response to the clock signal CLK, after the execution of the logic operation with the signals 82a, 83a respectively outputted from the latch circuits 82, 83, in the logic circuit 88, is outputted to the multiplexer 136 as an output signal 88a.

A delay circuit 89 delays the output signal 81a from the latch circuit 81, which is inputted to the delay circuit 89. In this case, a delay amount in the delay circuit 89 is defined such that a signal delayed by the delay circuit 89 is outputted from the delay circuit 89 when the output signal 88a is inputted to the multiplexer 136. That is, the delay amount in the delay circuit 89 corresponds to a logic delay in the logic circuit 88 (and a signal transmission delay while the output signal 88a is transmitted to the multiplexer 136).

Figure 8:
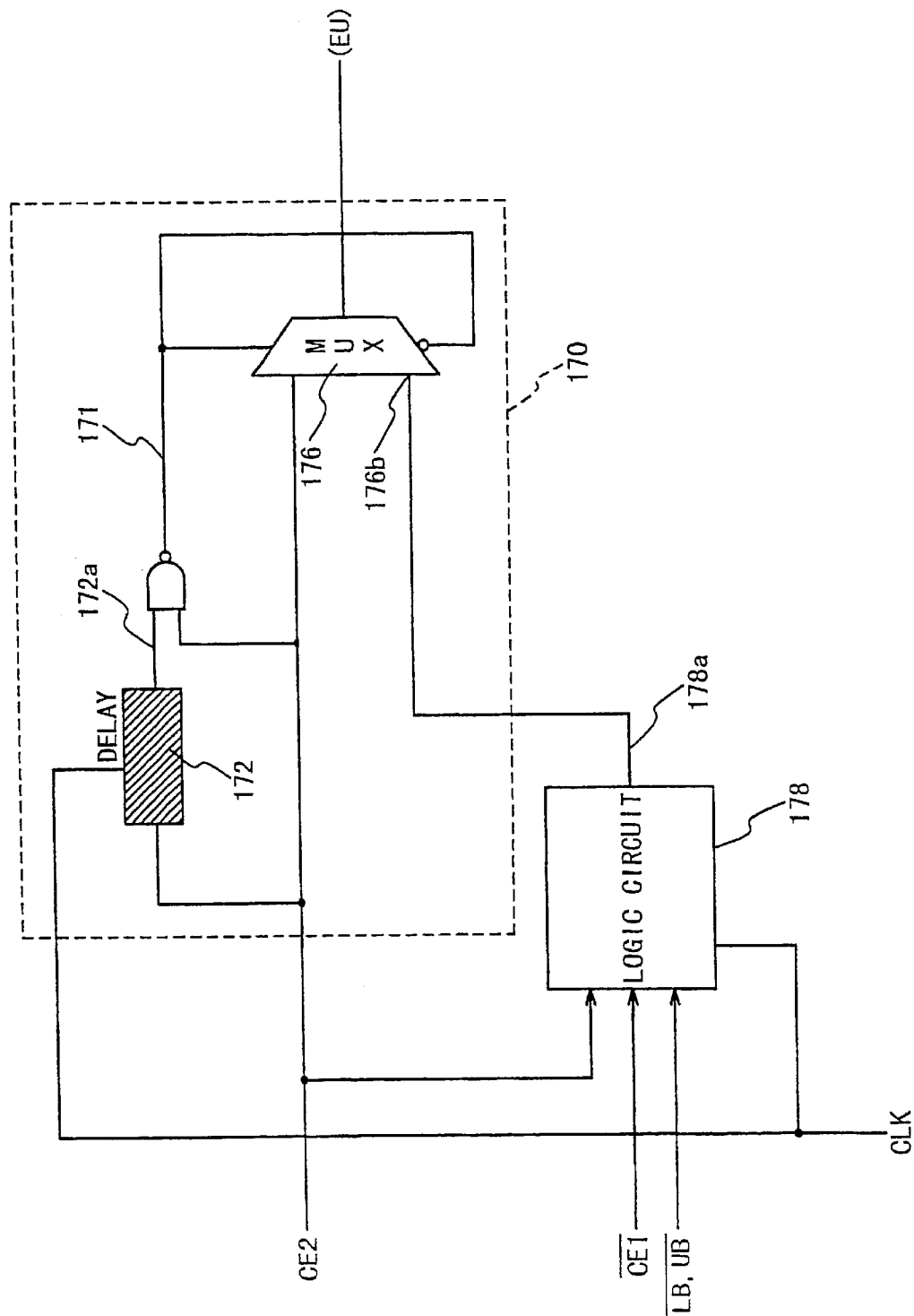
FIG. 8 is a circuit diagram showing a configuration of a fifth embodiment of a semiconductor apparatus in the present invention.

In the fifth embodiment shown in FIG. 8, the delay circuit 172 receives the clock signal CLK, and generates the delay having the necessary amount reflecting the clock signal CLK, based on the clock signal CLK. With regard to this point, in the sixth embodiment, the delay circuit 89 receives the signal 81*a* which is outputted from the latch circuit 81 in response to the clock signal CLK. Thus, the delay generated by the delay circuit 89 can reflect the clock signal CLK, similarly to the fifth embodiment.

In the first embodiment, it is described that the delay amount in the delay circuit 32 is the time corresponding to the signal transmission delays in the paths (A), (B). In this case, it is set that the inverted signal (B) of the OR logic signal 22 is outputted from the output section 36*c* at the substantially same time when the inverted signal (B) of the OR logic signal 22 reaches the input section 36*b*.

Instead of the above setting, the delay amount in the delay circuit 32 may be longer than the time corresponding to the signal transmission delays in the paths (A), (B). In this case, the inverted signal (B) of the OR logic signal 22 is outputted from the output section 36*c* after being delayed from the time when the inverted signal (B) of the OR logic signal 22 reaches the input section 36*b*.

Moreover, instead of the above-mentioned setting, the delay amount in the delay circuit 32 may be shorter than the time corresponding to the signal transmission delays in the paths (A), (B). In this case, when the CE2 signal and the /CE1 signal are at the selected state, the CE12 signal is changed as follows. At first, the CE12 signal is made at the selected state in accordance with the signal inputted to the input section 36*a*. Next, the multiplexer 36 is switched from the condition that the input section 36*a* is open and the input section 36*b* is close to the condition that the input section 36*a* is close and the input section 36*b* is open. The inverted signal (B) of the OR logic signal 22 does not reach the input section 36*b* in this switching timing. Thus, the CE12 signal becomes at the non-selected state. After that, when the inverted signal (B) of the OR logic signal 22 reaches the input section 36*b*, the CE12 signal becomes at the selected state. Even if the CE12 signal is changed from the selected state to the non-selected state and finally back to the selected state as mentioned above, the application to a circuit operated at a rising edge in a first selected state (through a first input signal to the input section 36*a*) has no influence on the operation.

According to the present invention, it is easy to attain a semiconductor memory apparatus in which an access time is short.

What is claimed is:

1. A semiconductor apparatus, comprising:
   an input unit inputting a first signal and a generation signal, said generation signal being generated based on said first signal and a second signal; and
   a control unit controlling said input unit such that one of said first signal and said generation signal is outputted, and
   wherein said input unit inputs said first signal prior to said generation signal, and
   wherein said control unit controls said input unit such that said generation signal instead of said first signal is outputted after an expiration of a predetermined time.

2. The semiconductor apparatus according to claim 1, wherein said control unit controls said input unit such that said first signal is outputted from said input unit until said generation signal is inputted to said input unit after said first signal is inputted to said input unit, and said generation signal instead of said first signal is outputted from said input unit when said generation signal is inputted to said input unit.

3. A semiconductor apparatus, comprising:
   a delay unit outputting a first delay signal obtained by delaying a first signal by a predetermined delay amount;
   a control signal generating unit generating a control signal based on said first signal and said first delay signal; and
   a signal outputting unit inputting said first signal and a generation signal to output one of said first signal and said generation signal in response to said control signal, said generation signal being generated based on said first signal and a second signal.

4. The semiconductor apparatus according to claim 3, wherein said predetermined delay amount is a substantially identical with a time that elapsed before said generation signal is inputted to said signal outputting unit after said first signal is inputted to said signal outputting unit.

5. The semiconductor apparatus according to claim 3, wherein said predetermined delay amount is longer than a time that elapsed before said generation signal is inputted to said signal outputting unit after said first signal is inputted to said signal outputting unit.

6. The semiconductor apparatus according to claim 3, wherein said predetermined delay amount can be variably adjusted.

7. The semiconductor apparatus according to claim 3, wherein said signal outputting unit inputs said first signal prior to said generation signal and outputs said first signal until inputting said generation signal after inputting said first signal and outputs said generation signal instead of said first signal when inputting said generation signal.

8. The semiconductor apparatus according to claim 4, wherein said signal outputting unit inputs said first signal prior to said generation signal and outputs said first signal until inputting said generation signal after inputting said first signal and outputs said generation signal instead of said first signal when inputting said generation signal.

9. The semiconductor apparatus according to claim 5, wherein said signal outputting unit inputs said first signal prior to said generation signal and outputs said first signal until inputting said generation signal after inputting said first signal and outputs said generation signal instead of said first signal when inputting said generation signal.

10. The semiconductor apparatus according to claim 6, wherein said signal outputting unit inputs said first signal prior to said generation signal and outputs said first signal until inputting said generation signal after inputting said first signal and outputs said generation signal instead of said first signal when inputting said generation signal.

11. A semiconductor apparatus, comprising:
    a latch circuit latching a first signal to output said first signal as a second signal in response to a clock signal;
    a control signal generating unit generating a control signal based on said first signal and said second signal; and
    a signal outputting unit inputting said first and second signals to output one of said first and second signals in response to said control signal.

12. A semiconductor apparatus, comprising:
    a latch circuit latching a first signal to output said first signal as a second signal in response to a clock signal;
    a control signal generating unit generating a control signal based on said first signal and said clock signal; and
    a signal outputting unit inputting said first and second signals to output one of said first and second signals in response to said control signal.

* * * * *